US008825450B2

(12) United States Patent
Artur et al.

(10) Patent No.: US 8,825,450 B2
(45) Date of Patent: Sep. 2, 2014

(54) METHOD AND SYSTEM FOR UPDATING A MODELED OBJECT IN A PRODUCT LIFECYCLE MANAGEMENT SYSTEM

(75) Inventors: Frédéric Guillaume Artur, Garches (FR); Stéphane Maitre, Monferran-Saves (FR); Yves Didier Cuzin, Saint Maur des Fossés (FR)

(73) Assignee: Dassault Systemes, Velizy Villacoublay (FR)

( * ) Notice: Subject to any disclaimer, the term of this patent is extended or adjusted under 35 U.S.C. 154(b) by 1168 days.

(21) Appl. No.: 12/603,833

(22) Filed: Oct. 22, 2009

(65) Prior Publication Data
US 2011/0098982 A1 Apr. 28, 2011

(51) Int. Cl.
*G06F 17/50* (2006.01)

(52) U.S. Cl.
CPC ..................................... *G06F 17/50* (2013.01)
USPC .......................................................... 703/1

(58) Field of Classification Search
USPC .......................................................... 703/1
See application file for complete search history.

(56) References Cited

U.S. PATENT DOCUMENTS

| | | | | |
|---|---|---|---|---|
| 6,629,065 | B1 * | 9/2003 | Gadh et al. | 703/1 |
| 6,898,560 | B1 * | 5/2005 | Das | 703/7 |
| 7,519,603 | B2 * | 4/2009 | Parker | 1/1 |
| 8,379,017 | B2 * | 2/2013 | Fransson et al. | 345/420 |
| 2003/0204527 | A1 * | 10/2003 | Callahan | 707/104.1 |
| 2006/0122721 | A1 | 6/2006 | Ouchi | |
| 2008/0033785 | A1 * | 2/2008 | Anke | 705/10 |
| 2008/0222114 | A1 * | 9/2008 | Schreiber | 707/3 |
| 2008/0306798 | A1 * | 12/2008 | Anke et al. | 705/8 |
| 2010/0274818 | A1 | 10/2010 | Chauvin et al. | |
| 2013/0144566 | A1 * | 6/2013 | De Biswas | 703/1 |

OTHER PUBLICATIONS

Dong et al., "Maintaining the Transitive Closure of Graphs in SQL"; 1999; International Journal of Information Technology, pp. 1-29.*

* cited by examiner

*Primary Examiner* — Kamini S Shah
*Assistant Examiner* — Juan Ochoa
(74) *Attorney, Agent, or Firm* — Hamilton, Brook, Smith & Reynolds, P.C.

(57) ABSTRACT

A computer-implemented method and system for updating a modeled object in a Product Lifecycle Management system is disclosed. The modeled object to be updated is modeled with a directed acyclic graph having at least one path. The path is formed of nodes and arcs, where: (i) each node represents a modeled object, and (ii) each arc represents the use of a respective end node by a corresponding origin node. The invention method and system build a first path of all successive nodes used by the modeled object to be updated. Next the invention method and system compute from the first path, a second path of nodes impacting the update of the modeled object to be updated. In turn, the invention method and system update the modeled object to be updated by using the nodes of the second path. The invention also provides a computerized system, such as a Product Lifecycle Management (PLM) system, comprising program code means for carrying out the method of the present invention.

19 Claims, 10 Drawing Sheets

METHOD AND SYSTEM FOR UPDATING A MODELED OBJECT IN A PRODUCT LIFECYCLE MANAGEMENT SYSTEM

RELATED APPLICATION(S)

This application has subject matter related to U.S. patent application Ser. No. 12/431,277, filed Apr. 28, 2009, which subsequently published on Oct. 28, 2010, as U.S. Patent Publication No. 2010/0274818 A1. The entire teachings of the above application(s) are incorporated herein by reference.

FIELD OF THE INVENTION

The invention relates to the field of computer-implemented programs and systems, and more specifically to a computer-implemented method for updating a modeled object in a Product Lifecycle Management (PLM) system, a computer program product adapted to implement said method and a PLM system adapted to perform said method.

BACKGROUND OF THE INVENTION

PLM solutions refer to a business strategy that helps companies to share product data, apply common processes, and leverage corporate knowledge for the development of products from conception to the end of their life, across the concept of extended enterprise. According to this concept, a company is made up not just of its company departments but also of other actors such as business partners, suppliers, Original Equipment Manufacturers (OEM), and customers. By including these actors, PLM may allow this network to operate as a single entity to conceptualize, design, build, and support products and processes.

Amongst the PLM solutions are the computer-aided techniques, which are known to include Computer-Aided Design (CAD). Computer-Aided Design relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations. Some PLM solutions make it possible, for instance, to design and develop products by creating digital mockups (a 3D graphical model of a product). The digital product may be first defined and simulated using an appropriate application. Then, the lean digital manufacturing processes may be defined and modeled.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional (3D) models of objects or assemblies of objects. CAD systems thus provide a representation of modeled objects using edges or lines, in certain cases with faces. Surfaces may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly, for instance an aircraft, may comprise thousands of parts. A CAD system manages models of objects, which are stored in electronic files. The graphical user interface (GUI) plays an important role as regards the efficiency of the technique.

More generally, the PLM solutions provided by Dassault Systèmes (under the trademarks CATIA, ENOVIA and DELMIA) provides an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

PLM information, including product configuration, process knowledge and resources information are typically intended to be edited in a collaborative way. For instance, a team of designers working in a collaborative way may individually contribute to design a product by accessing shared information related to the product from remote sites. Since several users may access the same PLM information, it is difficult for each of them to have a clear view of any changes made by other users.

Now, in the PLM world, data update is a constant problem, specifically as the set of objects to update are interrelated. By update, it is here meant updating object data with respect to object specifications. Since a first object such as a product may reuse a second object, any changes in the specifications of the second object must be reflected in the first object. In some case, the amount of data that comes into play is so important that it might be impossible to load all data in memory to update them.

Moreover, updating data is still complicated when users work in a collaborative way. In such a case, the client computers of the users may be in communication through a product data management (PDM) system, such as the one provided under the trademark ENOVIA, via a computer network such as a Local Area Network (LAN) or a Wide Area Network (WAN). Requests performed by a client computer pass over the network, and responses provided by the PDM system are also transported by the network. Transferring data of objects involves a huge consumption of the resources of the PDM system, but also a large consumption of the network bandwidth. As a result, the network is congested, and others networks parameters such as latency, delay, jitter, packet dropping probability, queuing delay, bit error rate are degraded. The network is overwhelmed and its overall performances decrease.

The U.S. patent application Ser. No. 12/431,277 by Assignee which is incorporated by reference herein, provides solutions for updating object data with respect to object specifications in a PLM system. An embodiment of these solutions comprise browsing the graph of dependence relations between objects. This embodiment substantially prevents from the risk of failures when updating PLM objects, and specifically objects edited in a collaborative way. To this aim, it relies on a smart use of dependence between objects.

Preventing risk of failures may not be sufficient when the number of objects in the PLM system is very high. One aim of the present invention is to improve the above-mentioned solution. This is achieved by reducing the number of objects to be taken into account.

SUMMARY OF THE INVENTION

The present invention is directed to a computer-implemented method for updating a modeled object in a Product Lifecycle Management system, the modeled object to be updated being modeled with a directed acyclic graph comprising at least one path comprising nodes and arcs, wherein:
each node represents a modeled object, and
each arc represents the use of an end node by an origin node, said method comprising the steps of:
building a first path of all successive nodes used by the modeled object to be updated;
computing, from the first path, a second path of nodes impacting the update of the modeled object to be updated; and
updating the modeled object to be updated by using the nodes of the second path.

In other embodiments, the method according to the invention may comprise one or more of the following features:
the root node of the first path represents the modeled object to be updated, and the last node of a path, starting from the root node, is a leaf node; the second path of nodes impacting the update of the modeled object is the path starting from the root node and ending at the node of the last modified object;
each arc further has one of the following status: a "synchronized" status, meaning that an origin node takes into account the changes of an end node; an "unsynchronized" status, meaning that an origin node does not take into account the changes of an end node;
the computing of the second path is performed by browsing all the arcs in the first path from the root node to the leaf node until the last arc having an unsynchronized status is retrieved, the second path being the path from the root node to the end node of said last arc;
at least one arc has a default status;
the default status of an arc is "unsynchronized";
the update of the modeled object is performed by propagating the update from a leaf node to the root node of a path;
the updated modeled object is stored;
the method further comprises the opening of a session in the Product Lifecycle Management system by loading the stored modeled object; and
the modeled object is a assembly modeled by a directed acyclic graph comprising a plurality of paths.

The invention is also directed to a computer program product comprising program code means for carrying out the method of the present invention.

The invention also provides a computerized system, such as a Product Lifecycle Management (PLM) system, comprising program code means for carrying out the method of the present invention.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

A system embodying the invention is described below, by way of non-limiting example, and in reference to the accompanying drawings which are as follows.

DETAILED DESCRIPTION OF THE INVENTION

A description of example embodiments of the invention follows.

The teachings of all patents, published applications and references cited herein are incorporated by reference in their entirety.

Figure 1:
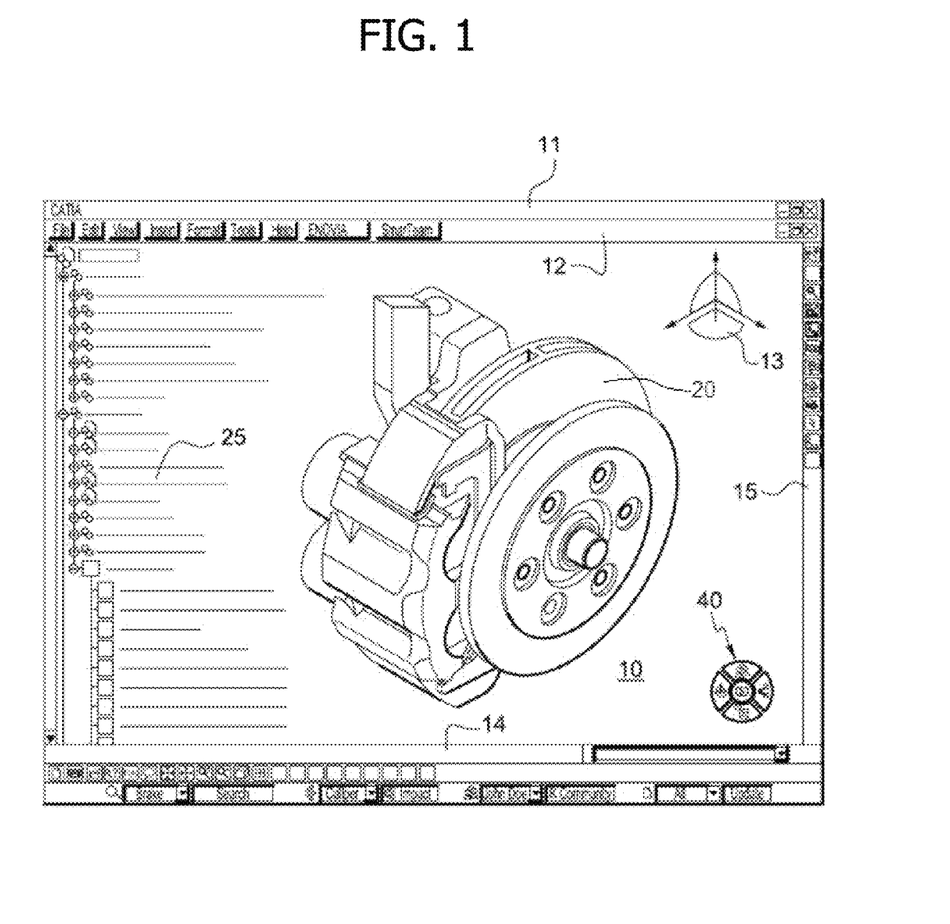
FIG. 1 represents an exemplified display of a CAD-like graphical user interface.

In reference to FIG. 1: in practice, several users are provided with a graphical user interface (or GUI) such as the one of CATIA. The users in question work in a collaborative way on various parts.

The exemplified GUI 10 may be a typical CAD-like interface, having standard menu bars 11, 12, as well as bottom and side toolbars 14, 15. Such menu- and toolbars contain a set of user-selectable icons, each icon being associated with one or more operations or functions, as known in the art.

Some of these icons are associated with other software tools, adapted for editing and/or working on a modeled product 20 or parts of product 20 such as that displayed in the GUI 10. In the following description, "product", "part", "assembly" and the like may be referred to as "part" for the sake of simplicity. Note that the concept of "part" can in fact be generalized to that of "object", wherein an object can be only a representative part of the designed product or, more generally, any software tool participating in the design process (but not necessarily "in" the final product).

The software tools may be grouped into workbenches, each workbench comprising a subset of software tools. In particular, one of the workbenches is an edition workbench, suitable for editing geometrical features of the modeled product or object 20. In operation, a designer may for example pre-select a part of the object 20 and then initiate an operation (e.g. change the dimension, color, etc.) or edit geometrical constraints by selecting an appropriate icon. For example, typical CAD operations are the modeling of the punching or the folding of a 3D modeled object displayed on the screen.

The GUI may for example display data 25 related to the displayed product 20. In the example of FIG. 1, the data 25, displayed as a "feature tree", and their 3D representation 20 pertain to a brake assembly including brake caliper and disc. The GUI may further show various types of graphic tool 13, 40, for example for facilitating 3D manipulation of the object, for triggering a simulation of an operation of an edited product or render various attributes of the displayed product 20.

The GUI is for instance adapted for allowing access to a PLM database, either on users request or as a background task, in contrast with usual CAD/CAM interfaces. Thus, in operation, a user who wishes to access the database does not have to pass from a first CAD window to a Product Data Management (PDM) window (for example by minimizing the first window and maximizing the second window), adapted for querying the database, and then go back to the CAD/CAM window. Such window switching operations, frequently carried out by designers, are time consuming and particularly inappropriate in the field of CAD/CAM.

For instance, GUIs similar to that identified by reference numeral 10 displayed in FIG. 1 may be run on other computers of the network. These computers may further benefit from similar local applications and a common environment.

As an example of one embodiment, the method of the invention is implemented in a computer network comprising user computers and one or more PDM system. The user computers are in communication with the PDM system. The PDM system may for example be located at a backbone of the network. The PDM system allows for the management of numerous documents, relations and data, possibly hierarchically interrelated. Such a PDM system is equipped with a PLM database having data related to modeled products, assemblies and product parts, which are likely to be edited by a designer.

A plurality of users may thus work in a collaborative way, on different objects such as parts, products or assemblies. This is likely to give rise to conflicts, not only while editing parts/products but also when updating them, as outlined in the introduction above.

The method of the invention makes use of a labeled directed acyclic graph (DAG) for modeling objects and their relations.

A graph is an abstract representation of a set of objects where some pairs of the objects are connected by relations (or links). The interconnected objects are represented by mathematical abstractions called nodes (or vertices), and the relations that connect some pairs of vertices are called arcs (or edges).

In the directed acyclic graph, each node represents an object.

The graph is said "directed" meaning that all arcs are oriented from an origin node to an end node. In addition the graph is said "labeled" which means that the direction of an arc represented by an arrow has a semantic significance. Each arc represents the use of an end node by an origin node. The graph is therefore a "reuse graph".

Finally the graph is said "acyclic" meaning that no cycle on arcs is allowed. The reuse graph has no cycle otherwise a product would be recursively defined by itself, which is a nonsense from the bill of material point of view. However whenever a graph contains cycles, it may be necessary to substitute the nodes in a cycle with a single node called a complex node as described in the U.S. patent application Ser. No. 12/431,277 and herein incorporated by reference. A directed graph without a cycle is also known as a tree.

Figure 2:
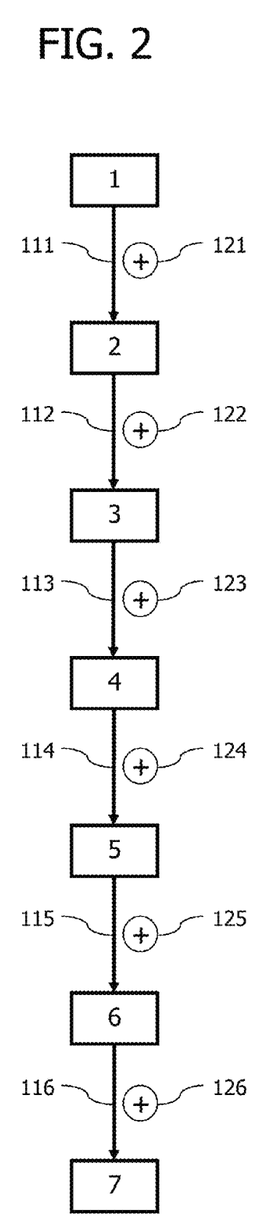
FIG. 2 represents a directed acyclic graph according to the invention organized in a path of nodes and arcs.
Figure 3:
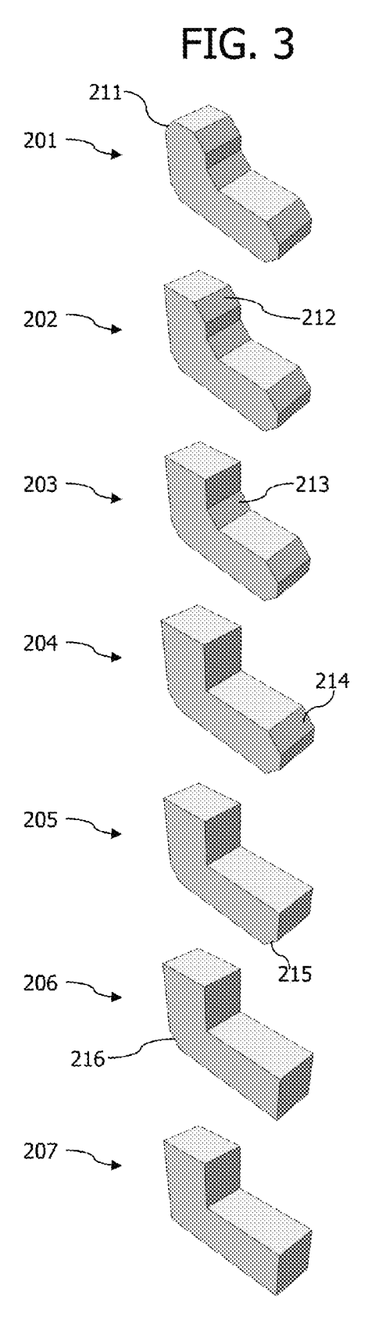
FIG. 3 represents a plurality of objects, each of which corresponds to a node of the directed acyclic graph of FIG. 2.

For the sake of simplicity, the method according to the invention is now described using a simple directed acyclic graph comprising a unique branch which is a "path" of nodes (or a chain of nodes) in reference to FIG. 2 and FIG. 3.

The path depicted in FIG. 2 comprises seven nodes 1-7. Each of the nodes 1-6 is an origin node and has an arrow-shaped arc 111-116 pointing to one of the nodes 2-7. The node 7 has no arc starting from itself and is known as a "leaf node". The node 1 has no arc pointing to itself and is known as a "root node". In the following examples, the modeled object 201 to be updated is represented by the root node 1.

The node 7 represents a modeled object 207 which is an L-shaped part as illustrated in FIG. 3. The node 6 has an arc 116 starting from itself and pointing to the node 7. It therefore means that the node 6 uses the node 7 or also that the modeled object 206 uses the modeled object 207. In addition to the use of the modeled object 207, the modeled object 206 further comprises a chamfer 216. In the same manner:

the node 5 has an arc 115 starting from itself and pointing to the node 6, the associated modeled object 205 uses the modeled object 206 and further comprises a chamfer 215;

the node 4 has an arc 114 starting from itself and pointing to the node 5, the associated modeled object 204 uses the modeled object 205 and further comprises a chamfer 214;

the node 3 has an arc 113 starting from itself and pointing to the node 4, the associated modeled object 203 uses the modeled object 204 and further comprises a chamfer 213;

the node 2 has an arc 112 starting from itself and pointing to the node 3, the associated modeled object 202 uses the modeled object 203 and further comprises a chamfer 212; and the node 1 has an arc 111 starting from itself and pointing to the node 2, the associated modeled object 201 uses the modeled object 202 and further comprises a chamfer 211.

According to an embodiment of the invention, each arc further comprises a synchronization status which allows knowledge as to whether the pointing object takes into account the changes of the object being pointed to (synchronized status) or not (unsynchronized status). A synchronized status is arbitrarily illustrated with the "+" symbol and the unsynchronized status is illustrated with the "−" symbol in all Figures. Other graphical or symbolic indicators are suitable.

Data relating to dependence between nodes and status of arc can be stored, for example as a value of an attribute in a PDM or by using any other techniques known in the art.

FIGS. 2 and 3 are representative of a state where the directed acyclic graph is "up to date", in particular the modeled object 201 to be updated and represented by the root node 1. Since all arcs 111-116 have a synchronized status 121-126, each origin node 1-6 correctly takes into account the changes of the end node 2-7 on which it points.

Figure 4:
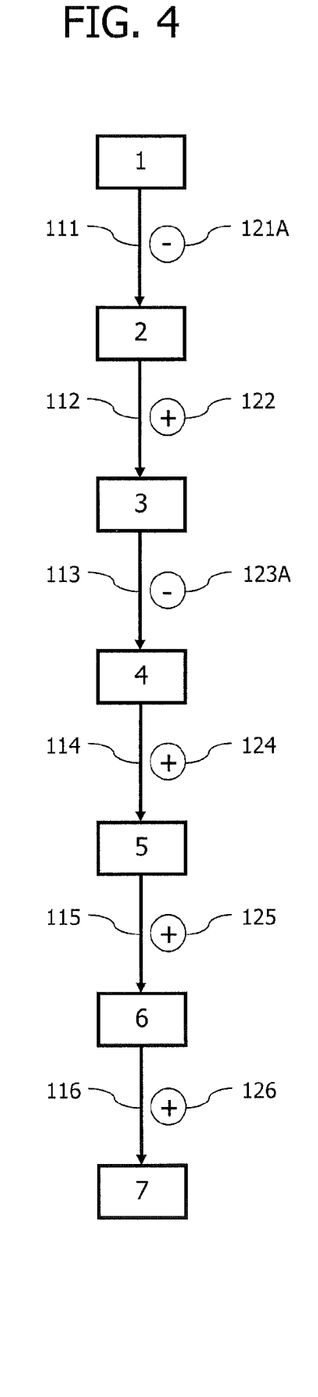
FIG. 4 represents a directed acyclic graph according to the invention with changes in some objects.
Figure 5:
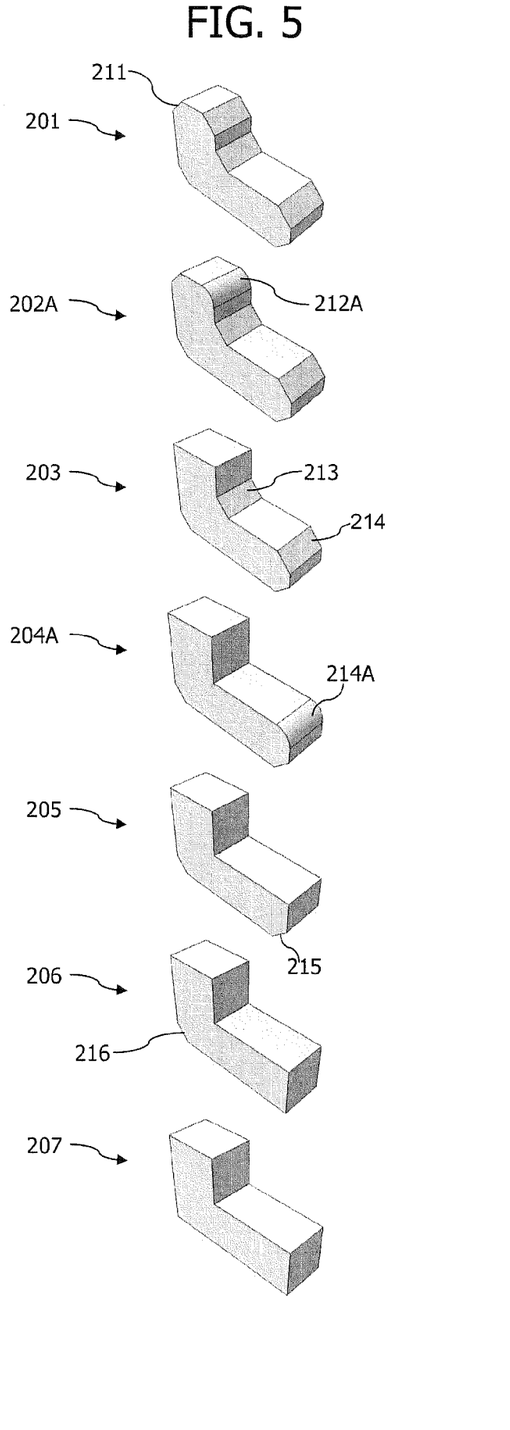
FIG. 5 represents a plurality of objects, each of which corresponds to a node of the directed acyclic graph of FIG. 4, with changes in some objects.

FIGS. 4 and 5 are representative of a state where the directed acyclic graph is "out of date", in particular the modeled object 201 to be updated and represented by the root node 1. FIG. 5 differs from FIG. 3 in that the modeled objects 204 and 202 have been modified. This can be done by one or more users during a collaborative work.

The chamfer 214 previously applied to the modeled object 204 represented by the node 4 is now replaced by an edge fillet 214A which leads to a newly defined modeled object 204A. Similarly, the chamfer 212 previously applied to the modeled object 202 represented by the node 2 is now replaced by an edge fillet 212A which leads to a newly defined modeled object 202A.

Modeled object 203 does not take into account the replacement of chamfer 214 by the edge fillet 214A, and still comprises the chamfer 214. Since no synchronization has been performed at this stage, the status 123A of the arc 113 is "unsynchronized". Similarly, modeled object 201 does neither take into account the replacement of chamfer 212 by the edge fillet 212A nor the replacement of chamfer 214 by the edge fillet 214A, and still comprises the chamfers 212 and 214. Since no synchronization has been performed at this stage, the status 121A of the arc 111 is "unsynchronized". Thus the modeled object 201 needs to be updated.

The first step of the method of updating the modeled object 201 represented by the root node 1 in the path is building the entire path of all successive nodes 2-7 used by the origin node 1. This is achieved by browsing the dependence relations illustrated with the arcs 111-116 between nodes 1-7 starting from the root node 1. During this first step the browser, which may be a computer-implemented program, checks whether the root node 1 points to another node (or more in a more complex graph) and retrieves the node 2. Then, the browser checks whether the node 2 points to another node and retrieves the node 3, and so on until a leaf node 7 is found, i.e. a node which does not point to any other node. During the browsing, data related to nodes and arcs are stored in memory. The result of the browsing is a directed graph. The use of the data of the directed graph for the updating process prevents against failure since this solution is robust. However, owing to the amount of modeled objects in certain cases, for instance an aircraft, the data to be stored may be too huge. The goal of the present invention is to reduce the amount of data.

Now referring back to FIG. 5, it appears that only a part of the graph is relevant for the update of the modeled object 201: the node 4 is up to date (arcs 114-116 have a respective synchronized status 124-126) and it is not necessary to take into account the nodes 5 to 7 to update the node 1 because the nodes 5 to 7 do not impact the update of the modeled object 201 and thus can be discarded. Therefore it is not necessary to load data of the irrelevant nodes 5-7. It is thus possible to reduce the size of the graph, or of the path in the present example.

Figure 6:
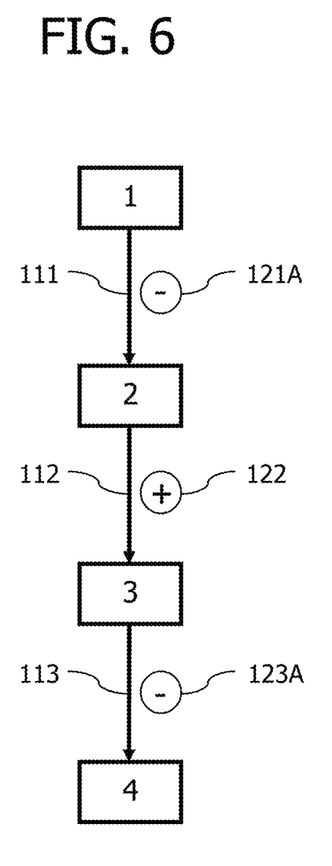
FIG. 6 represents a reduced directed acyclic graph according to the invention organized in a path of nodes and arcs.
Figure 7:
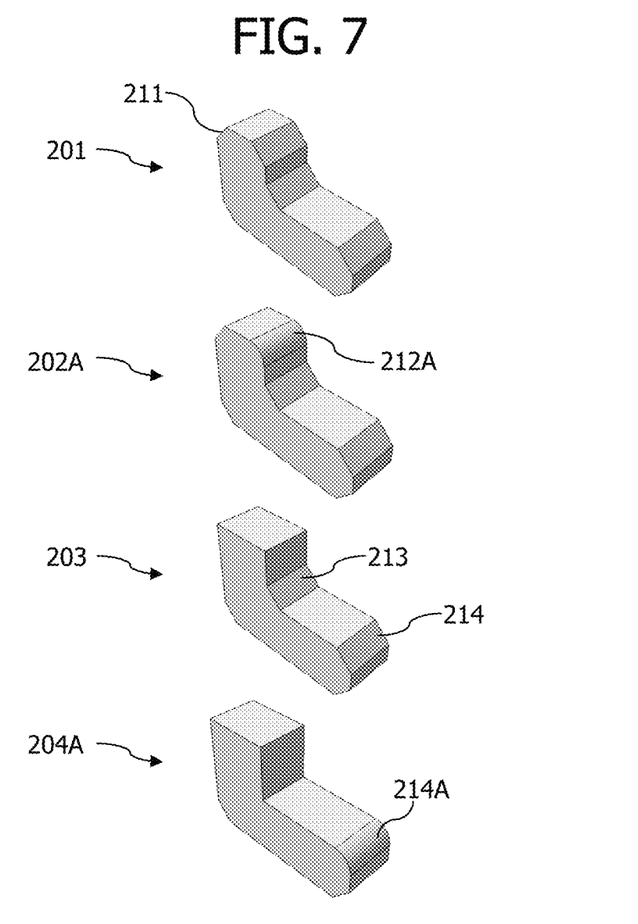
FIG. 7 represents a plurality of objects, each of which corresponds to a node of the directed acyclic graph of FIG. 6.

This is achieved in a second step by computing from this first path a second path of nodes impacting the update of the modeled object 201. Since the data related to the nodes 5-7 and to arcs 114-116 do not impact the update of the root node 1, nodes 5-7, arcs 114-116 and status data 124-126 can be withdrawn from the first path. The result of the withdrawals is illustrated in FIGS. 6-7. Since the path has now a reduced size, the data to load and process, and transfer over a network is accordingly significantly reduced.

In the meaning of the invention, a first node "impacting" the update of a second node means that the second node needs the information (changes) carried by the first node for its update. As viewable in FIG. 4, the three nodes 5-7 do not impact the update of the root node 1 since the root node 1 does not need the information carried by these three nodes 5-7 to be updated because the associated modeled objects 205-207 have not been modified. Conversely, the three nodes 2-4 do impact the update of the root node 1 since the root node 1 does need the information carried by these three nodes 2-4 to be updated.

The computing of the second path of nodes impacting the update of the modeled object 201, as illustrated in FIG. 6, is performed by retrieving, from the root node 1 to the leaf node 7 in the first path, the node 4 of the last modified object 204A. This is achieved by browsing the whole first path. The second path thereby reduced starts from the same root node 1 as the first path and ends at the node 4 of the last modified object 204A. The second path thereby built can therefore be seen as a "sufficient" or "minimal" path.

This second step of the method of updating the modeled object 201 is thus a reduction operation.

Since the amount of data to be treated is reduced thanks to the execution of the invention, the global work for updating of a modeled object is significantly reduced.

According to a preferred embodiment of the invention, this last modified object 204A can also be retrieved by browsing all the arcs 111-116 in the first path from the root node 1 to the leaf node 7 until the last arc 113 having an unsynchronized status 123A is retrieved. The second path is the path from the root node 1 of the first path to the end node 4 of the said last arc 113.

The third step of the method of updating the modeled object 201 according to the invention is the update of the modeled object 201 by using the nodes of the second path, depicted in FIG. 6, starting from the leaf node 4 there. The updates are to be successively propagated from this leaf node 4. The successive operations are described in three steps with reference to FIGS. 8 to 13.

Figure 8:
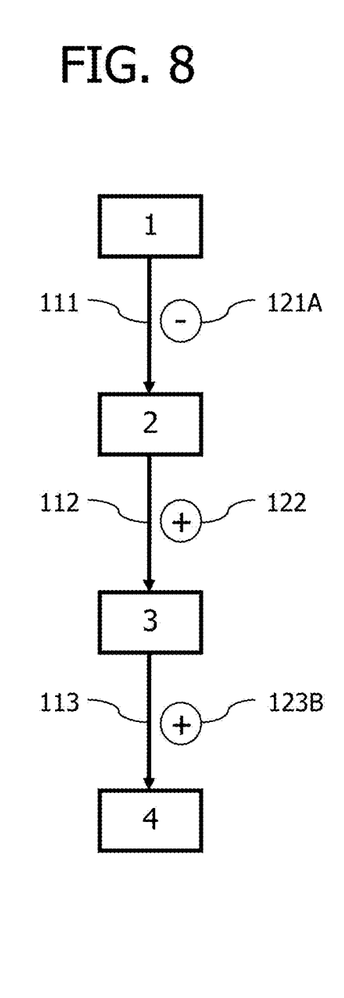
FIG. 8 represents a reduced directed acyclic graph according to the invention during a first step of the update propagation process.
Figure 9:
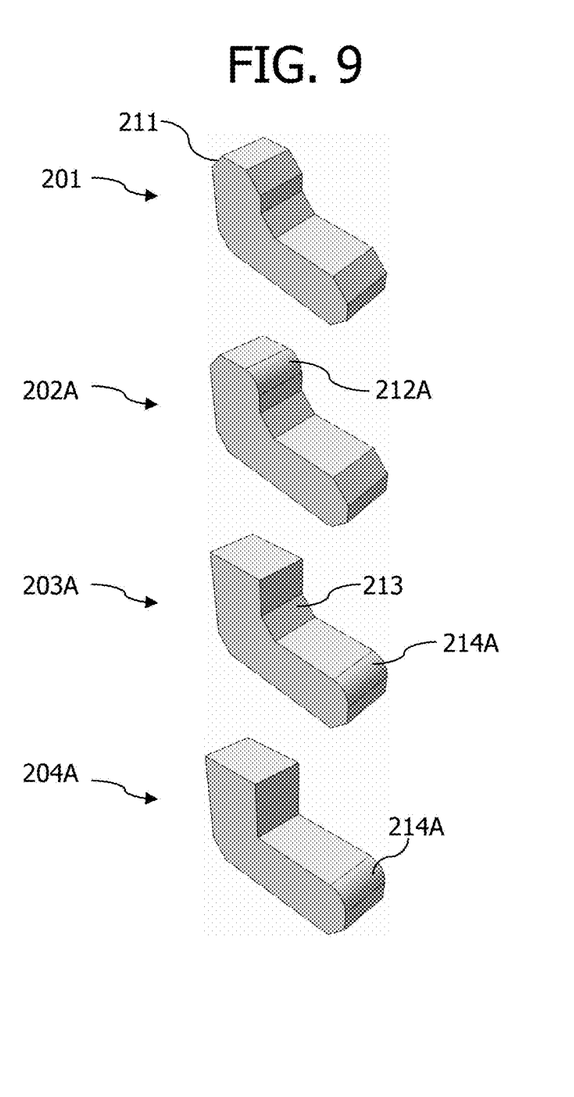
FIG. 9 represents a plurality of objects, each of which corresponds to a node of the directed acyclic graph of FIG. 8.

Referring to FIG. 8, node 3 was updated and now takes into account the changes of node 4. As viewable in FIG. 9, the new modeled object 203A has replaced the previous modeled object 203. The new modeled object 203A takes into account the replacement of the previous chamfer 214 by an edge fillet 214A and is thus up to date. Subsequent to this update operation, the status 123B of the arc 113 is now synchronized.

Figure 10:
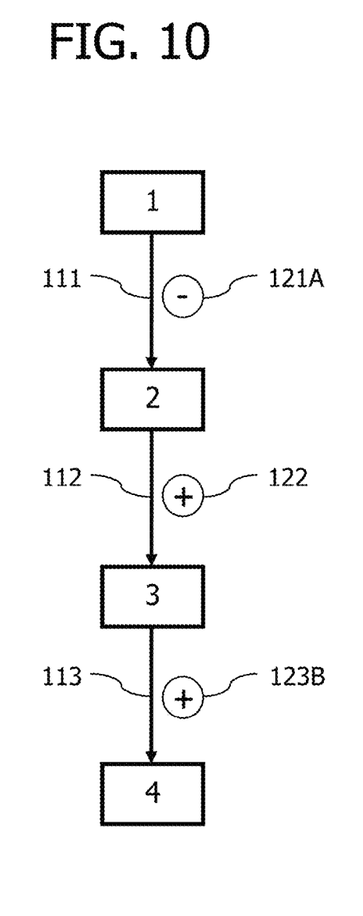
FIG. 10 represents a reduced directed acyclic graph according to the invention during a second step of the update propagation process.
Figure 11:
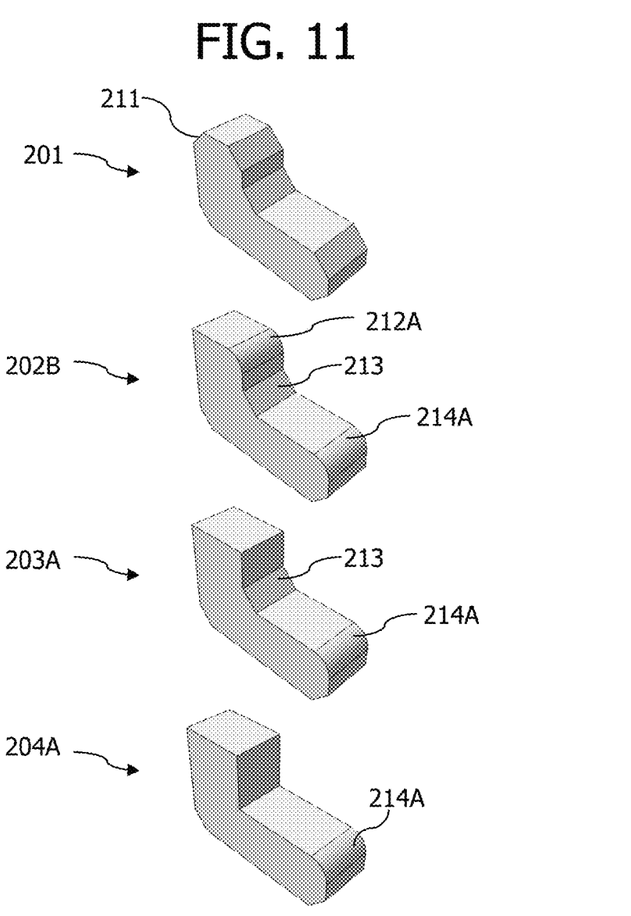
FIG. 11 represents a plurality of objects, each of which corresponds to a node of the directed acyclic graph of FIG. 10.

Referring to FIG. 10, node 2 was updated and now takes into account the changes of node 4. As viewable in FIG. 11, the new modeled object 202B has replaced the previous modeled object 202A. The new modeled object 202B takes into account the previous replacement of the previous chamfer 214 by an edge fillet 214A and is thus up to date. There is no need to change the status 122 of the arc 112 which remains synchronized.

Figure 12:
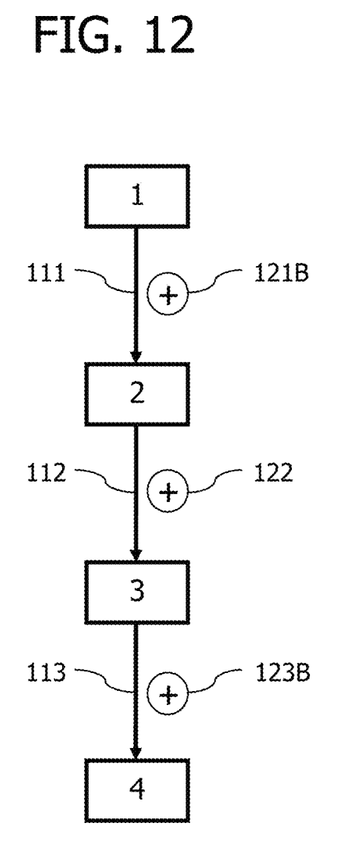
FIG. 12 represents a reduced directed acyclic graph according to the invention during a third step of the update propagation process.
Figure 13:
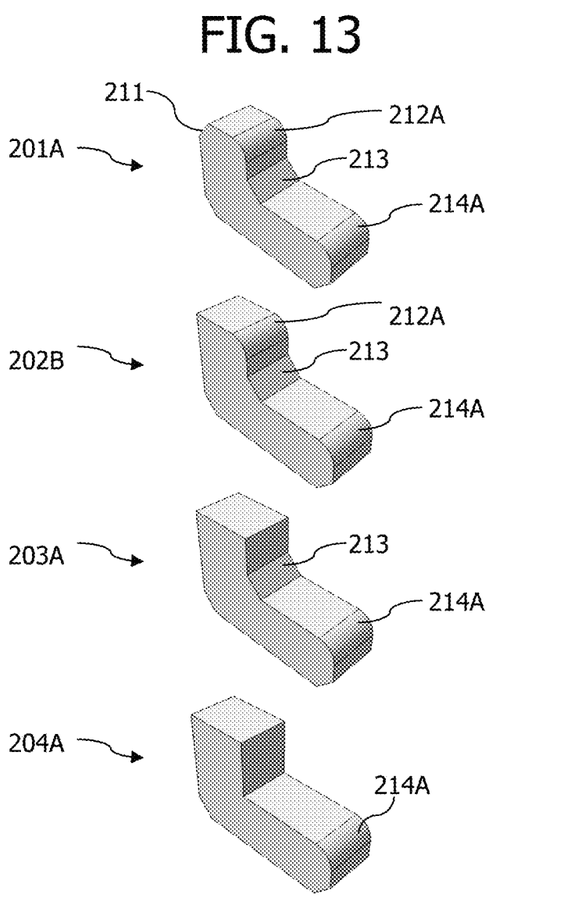
FIG. 13 represents a plurality of objects each of which corresponds to a node of the directed acyclic graph of FIG. 12.

Referring to FIG. 12, node 1 was updated and now takes into account the changes of nodes 4 and 2. As viewable in FIG. 13, the new modeled object 201A has replaced the previous modeled object 201. The new modeled object 201A takes into account both the replacement of the previous chamfer 214 by an edge fillet 214A and the replacement of the previous chamfer 212 by an edge fillet 212A, and is thus up to date. Subsequent to this update operation, the status 121B of the arc 111 is now synchronized.

As stated above, a directed acyclic graph having only one path is a simple example taken for the sake of simplicity. However, a product often comprises a plurality of parts and is thus an assembly. The directed acyclic graph of an assembly comprises a plurality of paths, each of which corresponds to a part of the assembly.

The directed acyclic graph of an assembly comprises at least one node which is an origin node where start at least two arcs, each of which pointing to a different end node. When such a situation occurs, the node of an assembly may simply be seen as an aggregation of the nodes of the parts composing the assembly into a unique node. An example illustrating this situation is described in FIGS. 14 and 15 where:
- a node 1 represents an object 201B,
- a node 8 represents an object 208, and
- a node 18 represents an assembly 218 of the two objects 201B and 208.

Figure 14:
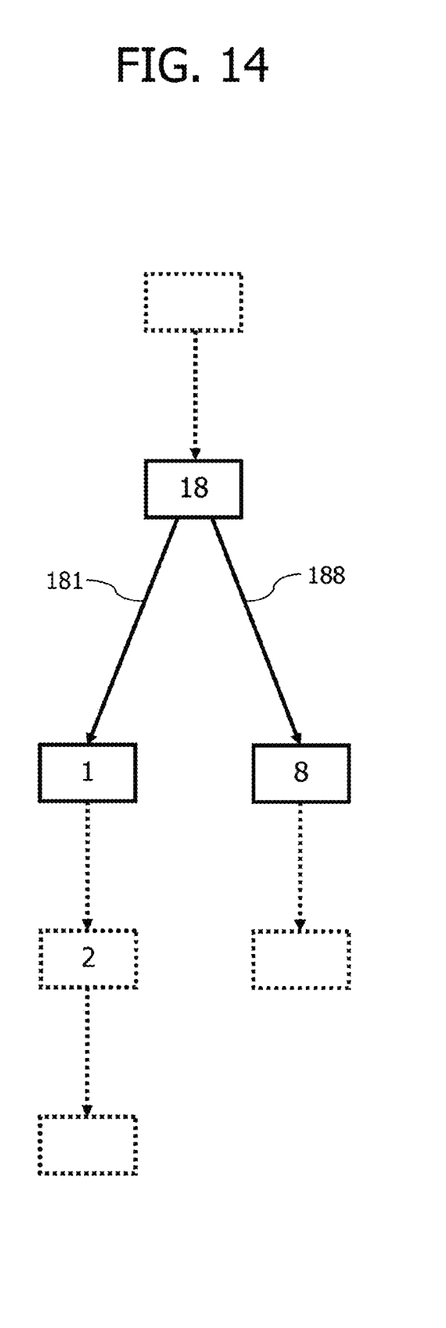
FIG. 14 represents a simplified directed acyclic graph according to the invention having two paths.
Figure 15:
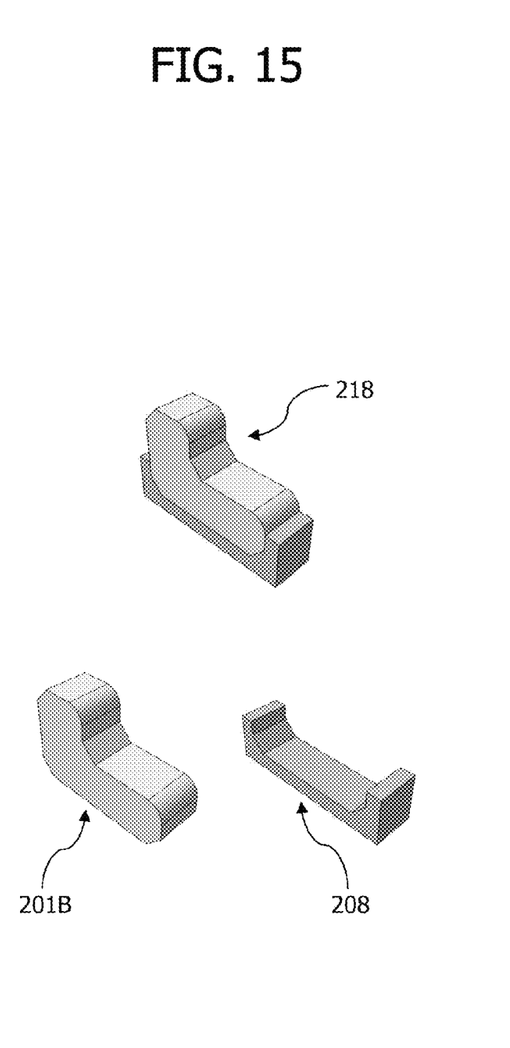
FIG. 15 represents two objects forming an assembly, each of objects or assembly corresponds to a node of the directed acyclic graph of FIG. 14.

In this example, the method of the invention must be performed first on each path (or branch 181 and 188) separately, i.e. on the first path having a root node 1, on one hand, and on the second path having a root node 8, on the other hand. Then, the node 18 must be treated as an aggregation of the nodes 1 and 8, as if there is a unique path having a leaf node 18. The method of the invention must then be performed on this unique path.

According to an embodiment of the invention, at least one arc has a default status. The default status is "unsynchronized". This embodiment may be useful when a legacy object is used, the creation of which is prior to the present invention. In such a case, it is necessary to create an arc with a default status of "unsynchronized" type.

It can now be understood that, when the invention is applied to a complex modeled object such as an assembly having thousands of parts, the time can advantageously be saved and resource consumption can significantly be reduced.

The invention prevents users from searching and performing themselves all the successive updates. It therefore significantly reduces the chance to make errors, particularly in a complex modeled object. Since the users do not need to carry out these time-consuming tasks themselves, they can spend more time doing more constructive activities.

Since the amount of data to process is reduced thanks to the invention, resource consumption is reduced. In addition, data to transmit through a network is also advantageously reduced.

Figure 16:
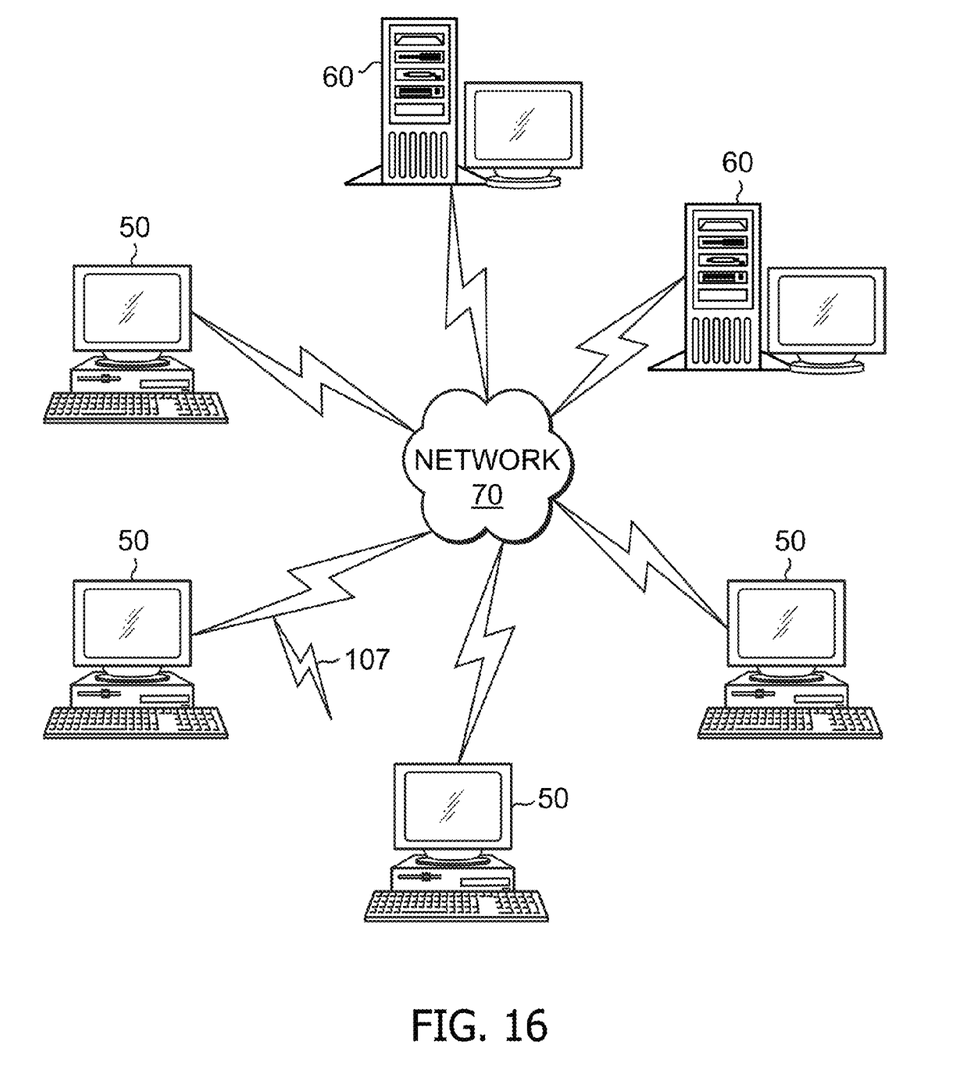
FIG. 16 is a schematic view of a computer network environment deploying embodiments of the present invention.

FIG. 16 illustrates a computer network or similar digital processing environment in which the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 17:
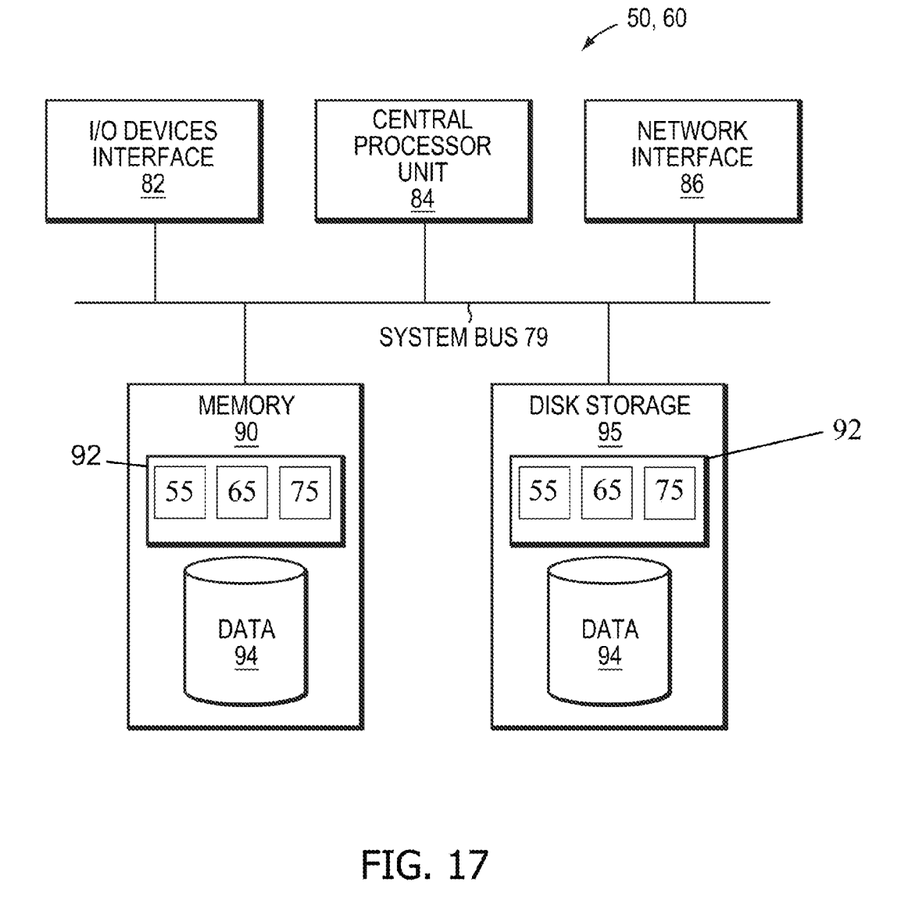
FIG. 17 is a block diagram of computer nodes of the network of FIG. 16.

FIG. 17 is a diagram of the internal structure of a computer (e.g., client processor/device 50 or server computers 60) in the computer system of FIG. 16. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 16). Memory 90 provides volatile storage for computer software instructions 92 and data 94 used to implement an embodiment of the present invention (e.g., a first path builder 55, means 65 for computing a second path, an updater 75 implementing the method discussed in FIGS. 4-13, and supporting code detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for updating a CAD/CAM modeled object to be updated in a Product Lifecycle Management (PLM) system, the method comprising:
    (a) accessing a directed acyclic graph modeling a CAD/CAM modeled object to be updated, the CAD/CAM modeled object to be updated being a modeled object in a CAD/CAM model in the PLM system, and the directed acyclic graph comprising at least one path comprising nodes and arcs, wherein:
    each node represents a respective modeled object in the CAD/CAM model, and
    each arc represents the use of an end node by an origin node, and wherein each arc further has one of the following status:

a "synchronized" status, meaning that an origin node takes into account the changes of an end node, and
an "unsynchronized" status, meaning that an origin node does not take into account the changes of an end node;
(b) building a first path of all successive nodes used by the CAD/CAM modeled object to be updated, the first path comprising a root node;
(c) computing, from the first path, a second path of nodes impacting the update of the CAD/CAM modeled object to be updated, said second path excluding (i) nodes of the first path that are irrelevant to the update of the CAD/CAM modeled object, and (ii) arcs of synchronized status, such that said second path has reduced data relative to the first path; and
(d) updating the CAD/CAM modeled object to be updated and the CAD/CAM model by using the nodes of the second path exclusive of the nodes of the first path that are irrelevant to the update of the CAD/CAM modeled object, said nodes of the second path being nodes of arcs of unsynchronized status.

2. A computer-implemented method of claim 1 wherein:
the root node of the first path represents the CAD/CAM modeled object to be updated, and
the last node of a path, starting from the root node, is a leaf node;
the second path of nodes impacting the update of the CAD/CAM modeled object to be updated is the path starting from the root node and ending at the node of a last modified object.

3. A computer-implemented method of claim 1 wherein the computing of the second path is performed by browsing all the arcs in the first path from the root node to the leaf node until the last arc having an unsynchronized status is retrieved, the second path being the path from the root node to the end node of said last arc.

4. A computer-implemented method of claim 3 wherein at least one arc has a default status.

5. A computer-implemented method of claim 4 wherein the default status of an arc is "unsynchronized".

6. A computer-implemented method of claim 3 wherein the update of the CAD/CAM modeled object to be updated is performed by propagating the update from a leaf node to the root node of a path.

7. A computer-implemented method of claim 6 wherein the updated CAD/CAM modeled object is stored.

8. A computer-implemented method of claim 7 further comprising opening a session in the Product Lifecycle Management system by loading the stored updated CAD/CAM modeled object.

9. A computer-implemented method of claim 1 wherein the CAD/CAM modeled object is an assembly modeled by a directed acyclic graph comprising a plurality of paths.

10. A non-transitory computer program product configured to update a CAD/CAM modeled object to be updated in a Product Lifecycle Management (PLM) System, the CAD/CAM modeled object to be updated being modeled with a directed acyclic graph comprising at least one path formed of nodes and arcs;
the computer program product comprising:
a non-transitory computer readable medium embodying program code which when executed by a digital processor causes:
in the directed acyclic graph, each node representing a respective modeled object in a CAD/CAM model in the PLM system and each arc representing use of a respective end node by a respective origin node, wherein each arc further has one of the following status:
a "synchronized" status, meaning that an origin node takes into account the changes of an end node, and
an "unsynchronized" status, meaning that an origin node does not take into account the changes of an end node;
building a first path of all successive nodes used by the CAD/CAM modeled object to be updated, the first path comprising a root node;
computing, from the first path, a second path of nodes impacting the update of the CAD/CAM modeled object to be updated, said second path excluding (i) nodes of the first path that are irrelevant to the update of the CAD/CAM modeled object, and (ii) arcs of synchronized status, such that said second path has reduced data relative to the first path; and
updating the CAD/CAM modeled object to be updated and the CAD/CAM model by using the nodes of the second path exclusive of the nodes of the first path that are irrelevant to the update of the CAD/CAM modeled object, said nodes of the second path being nodes of arcs of unsynchronized status.

11. A non-transitory computer program product as claimed in claim 10 wherein:
the root node of the first path represents the CAD/CAM modeled object to be updated, and
the last node of a path, starting from the root node, is a leaf node;
the second path of nodes impacting the update of the CAD/CAM modeled object to be updated is the path starting from the root node and ending at the node of a last modified object.

12. A non-transitory computer program product as claimed in claim 10 wherein the computing of the second path is performed by browsing all the arcs in the first path from the root node to the leaf node until the last arc having an unsynchronized status is retrieved, the second path being the path from the root node to the end node of said last arc.

13. A non-transitory computer program product as claimed in claim 12 wherein the updating of the CAD/CAM modeled object to be updated is performed by propagating the update from a leaf node to the root node of a path.

14. A non-transitory computer program product as claimed in claim 10 wherein the CAD/CAM modeled object is an assembly modeled by a directed acyclic graph comprising a plurality of paths.

15. A computer system comprising:
a processor configured to implement a Product Lifecycle Management (PLM) system, the PLM system configured to update a CAD/CAM modeled object to be updated, the CAD/CAM modeled object to be updated being a modeled object in a CAD/CAM model in the PLM system, and the CAD/CAM modeled object to be updated being modeled with a directed acyclic graph comprising at least one path formed of nodes and arcs, wherein each node represents a respective modeled object in the CAD/CAM model in the PLM system, and each arc represents use of a respective end node by a corresponding origin node, and wherein each arc further has one of the following status:
a "synchronized" status, meaning that an origin node takes into account the changes of an end node, and
an "unsynchronized" status, meaning that an origin node does not take into account the changes of an end node;
a builder executed by the processor and building a first path of all successive nodes used by the CAD/CAM modeled object to be updated, the first path comprising a root node, wherein a second path is computed from the first path, the second path being formed of nodes impacting the update of the CAD/CAM modeled object to be updated, said second path excluding (i) nodes of the first path that are irrelevant to the update of the CAD/CAM modeled object, and (ii) arcs of synchronized status, such that said second path has reduced data relative to the first path; and an updater executed by the processor and updating the CAD/CAM modeled object to be updated and the CAD/CAM model by using the nodes of the second path exclusive of the nodes of the first path that are irrelevant to the update of the CAD/CAM modeled object, said nodes of the second path being nodes of arcs of unsynchronized status.

16. A computer system as claimed in claim 15 wherein:

the root node of the first path represents the CAD/CAM modeled object to be updated, and the last node of a path, starting from the root node, is a leaf node;

the second path of nodes impacting the update of the CAD/CAM modeled object to be updated is the path starting from the root node and ending at the node of a last modified object.

17. A computer system as claimed in claim 16 wherein the computing of the second path is performed by browsing all the arcs in the first path from the root node to the leaf node until the last arc having an unsynchronized status is retrieved, the second path being the path from the root node to the end node of said last arc.

18. A computer system as claimed in claim 15 where the updater executed by the processor updates the CAD/CAM modeled object to be updated by propagating an update from a leaf node to root node of a path.

19. A computer system as claimed in claim 15 wherein the CAD/CAM modeled object is an assembly modeled by a directed acyclic graph comprising a plurality of paths.

* * * * *